(12) United States Patent
Stupar et al.

(10) Patent No.: US 8,187,972 B2
(45) Date of Patent: May 29, 2012

(54) THROUGH-SUBSTRATE VIAS WITH POLYMER FILL AND METHOD OF FABRICATING SAME

(75) Inventors: Philip A. Stupar, Oxnard, CA (US); Jeffrey F. DeNatale, Thousand Oaks, CA (US); Robert L. Borwick, III, Thousand Oaks, CA (US); Alexandros P. Papavasiliou, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 0 days.

(21) Appl. No.: 13/014,585

(22) Filed: Jan. 26, 2011

(65) Prior Publication Data

US 2011/0121427 A1 May 26, 2011

Related U.S. Application Data

(63) Continuation-in-part of application No. 12/217,217, filed on Jul. 1, 2008.

(51) Int. Cl.
*H01L 21/44* (2006.01)

(52) U.S. Cl. .......................... 438/667; 438/386; 257/532

(58) Field of Classification Search .................. 257/532; 438/386, 667
See application file for complete search history.

(56) References Cited

U.S. PATENT DOCUMENTS

| | | | |
|---|---|---|---|
| 4,855,017 A | 8/1989 | Douglas | 156/643 |
| 4,961,821 A | 10/1990 | Drake et al. | 156/647 |
| 5,421,083 A | 6/1995 | Suppelsa et al. | 29/852 |
| 5,501,893 A | 3/1996 | Laermer et al. | 428/161 |
| 5,699,613 A | 12/1997 | Chong et al. | 29/852 |
| 6,278,181 B1 | 8/2001 | Maley | 257/712 |
| 6,312,621 B1 | 11/2001 | Pedigo et al. | 252/500 |
| 6,358,849 B1 | 3/2002 | Havemann et al. | 438/689 |
| 6,458,615 B1 | 10/2002 | Fedder et al. | 438/50 |
| 6,565,730 B2 | 5/2003 | Chakravorty et al. | 205/122 |
| 6,716,737 B2 | 4/2004 | Plas et al. | 438/612 |
| 6,717,071 B2 | 4/2004 | Chang et al. | 174/266 |

(Continued)

FOREIGN PATENT DOCUMENTS

EP 096723 A1 6/1999

(Continued)

OTHER PUBLICATIONS

Semiconductor Equipment Assessment, Results Bulletin, Microsystems Production Evaluated STS Aspect Silicon Etch Cluster Tool, available online at: http://www.sea.rl.ac.uk/NewSea/newpubs/microspect/microspect_results.pdf.

(Continued)

*Primary Examiner* — Kiesha Bryant
*Assistant Examiner* — Marvin Payen
(74) *Attorney, Agent, or Firm* — Koppel, Patrick, Heybl & Philpott

(57) ABSTRACT

An through-substrate via fabrication method requires forming a through-substrate via hole in a semiconductor substrate, depositing an electrically insulating, continuous and substantially conformal isolation material onto the substrate and interior walls of the via using ALD, depositing a conductive material into the via and over the isolation material using ALD such that it is electrically continuous across the length of the via hole, and depositing a polymer material over the conductive material such that any continuous top-to-bottom openings present in the via holes are filled by the polymer material. The basic fabrication method may be extended to provide vias with multiple conductive layers, such as coaxial and triaxial vias.

17 Claims, 4 Drawing Sheets

U.S. PATENT DOCUMENTS

| | | | |
|---|---|---|---|
| 6,852,627 B2 | 2/2005 | Sinha et al. | 438/687 |
| 6,930,038 B2 | 8/2005 | Lin et al. | 438/633 |
| 6,960,479 B2 | 11/2005 | Li et al. | 438/3 |
| 6,960,495 B2 | 11/2005 | Vyvoda | 438/131 |
| 6,963,483 B2 | 11/2005 | Chakravorty et al. | 361/306.3 |
| 6,968,110 B2 | 11/2005 | Patel et al. | 385/131 |
| 6,984,561 B2 | 1/2006 | Herner et al. | 438/257 |
| 6,995,072 B2 | 2/2006 | Walker et al. | 438/400 |
| 7,001,782 B1 | 2/2006 | Diana et al. | 438/3 |
| 7,030,007 B2 | 4/2006 | Kumada et al. | 438/637 |
| 7,695,994 B2 | 4/2010 | Liu et al. | 438/54 |
| 2002/0134581 A1 | 9/2002 | Figueroa | |
| 2003/0003724 A1 | 1/2003 | Uchiyama et al. | |
| 2003/0104649 A1 | 6/2003 | Ozgur et al. | |
| 2004/0069529 A1 | 4/2004 | Oggioni et al. | |
| 2004/0119166 A1 | 6/2004 | Sunohara | |
| 2004/0149490 A1* | 8/2004 | Chang et al. | 174/266 |
| 2004/0166688 A1 | 8/2004 | Xie et al. | |
| 2005/0093048 A1 | 5/2005 | Griffiths | |
| 2005/0093049 A1 | 5/2005 | Kundalgurki et al. | |
| 2005/0099762 A1 | 5/2005 | Wermer et al. | |
| 2005/0287760 A1 | 12/2005 | Yan et al. | |
| 2006/0003566 A1 | 1/2006 | Emesh | |
| 2006/0292866 A1* | 12/2006 | Borwick et al. | 438/667 |
| 2007/0180916 A1* | 8/2007 | Tian et al. | 73/649 |

FOREIGN PATENT DOCUMENTS

| | | |
|---|---|---|
| WO | WO 8302368 A1 | 7/1983 |
| WO | WO 9908318 | 2/1999 |

OTHER PUBLICATIONS

Eisenbraun, et al., 3D Integration—The Packaging Technology for Tomorrow's Performance Needs, CHIP 9, Unaxis Semiconductors. (Sep. 2003). pp. 14-17.

Liu, C., Progress in MEMS and Micro Systems Research.IMAPS/ACerS 1$^{st}$ International Conference and Exhibition on Ceramic Interconnect and Ceramic Microsystems Technologies (CICMT), Baltimore Marriott Waterfront Hotel, Baltimore MD, (Apr. 10-13, 2005).

Pham, N. et al., IC-Compatible Two-Level Bulk Micromachining Process Module for RF Silicon Technology, IEEE Transactions on Electron Devices, vol. 48, No. 8, (Aug. 2001), pp. 1756-1764.

Garrou, Phillip, Future ICs GO Vertical, Research & Development Institute, Feb. 1, 2005, pp. 1-8.

George, S. M. et al., Surface Chemistry for Atomic Layer Growth, J. Phys. Chem., vol. 100, No. 31, 1996.pp. 13121-13131.

* cited by examiner

THROUGH-SUBSTRATE VIAS WITH POLYMER FILL AND METHOD OF FABRICATING SAME

RELATED APPLICATIONS

This application is a continuation-in-part of U.S. application Ser. No. 12/217,217 filed on Jul. 1, 2008, and claims priority of that application as to all matter disclosed therein.

FIELD OF THE INVENTION

This invention is directed to a method for fabricating through-substrate vias.

BACKGROUND

The fabrication of integrated circuit (IC) chips has become a sophisticated process that can allow complex circuitry to be densely packaged onto a single substrate or wafer. Originally, most chips were fabricated in a simple planar design. However, planar chip designs limit the amount of circuitry that can be placed on a single substrate.

To overcome some of the limitations resulting from the planar design, designers began stacking chips to form three-dimensional designs. Vias extending through the substrate—i.e., "through-substrate vias"—create three-dimensional interconnects which facilitate connection to the circuitry throughout the chip, thereby allowing the implementation of more advanced circuits and enabling a higher density of complex circuitry to be placed within a given die area. Furthermore, a three-dimensional design with through-substrate vias can enable advanced micro-electronic chip stacking, which can result, for example, in increased processing power for image data and signal processing.

Although three-dimensional chips using through-substrate vias have proven useful, they are currently limited. In one approach, through-substrate vias have been formed in thick substrates—e.g., 200-400 µm; the thickness enables the substrates to retain mechanical durability and to be easily handled and processed without the need for sequential stacking and thinning operations. Using this approach, substrates are etched and the formed vias are electrically insulated and metallized.

Although this approach provides some advantages, it introduces other limitations, such as the inability to fabricate small-diameter, fine-pitch vias. Indeed, using current etching techniques, the formation of high aspect ratio (i.e., ratio of depth to diameter) vias results in a large diameter-to-pitch (i.e., the center-to-center measurement between vias) ratio for the vias. This limits the etch depth of the vias, and also reduces the amount of available space on the substrate for other uses. Current techniques typically produce vias having diameters of about 4 µm with a depth of about 20 µm (using low temperature techniques) and 100 µm diameters with a depth of about 500 µm (using high temperature techniques); thus, an aspect ratio of about 5:1 is provided with either high or low temperature techniques. Both dry etching and wet etching have been demonstrated for the thick wafer processing, and both suffer from constraints on via size and separation. In addition, it is very difficult to reliably deposit electrical isolation layers and metallic conductors using low process temperatures in high aspect ratio vias.

To reduce via diameters, some techniques sequentially stack, bond and thin multiple wafers into a 'single' wafer stack and form the vias through only a single thin layer of the stacked wafers at a time, thereby reducing the aspect ratio and diameter required of an individual via. This approach involves wafer 'thinning', in which the wafers to be stacked are bonded and one portion (non-circuit containing, exposed surface) of the stacked wafers is thinned to reduce the wafer thickness, typically down to 10-25 µm. At this thickness, small diameter vias can be etched through the thinned layer while maintaining separation between neighboring vias. Alternatively, the via could be etched to a limited depth prior to the bonding, and then have its bottom (non-circuit containing) surface exposed in the thinning operation after bonding.

This approach can use well-developed fabrication processes; however, disadvantages arise from the need for sequential processing of each successive layer and the complexity of intermediate testing. Further, the thinning of the stacked wafers reduces their integrity and makes them more susceptible to breakage during use and damage from handling. Further still, many current bonding techniques involve high temperatures, high voltage and/or high pressure, each of which poses difficulties if the stacking includes prefabricated integrated circuits with multi-level interconnects. Further, in this approach sequential circuit wafers can only be stacked in one orientation, with active circuitry at the bond interface, since the thinning process must only remove unprocessed substrate. Finally, the wafer-level sequential stacking can introduce stacked device yield impacts resulting from the random alignment of defects in a die from one layer with a good die in another, reducing operability at the stack level.

In addition to a hole that passes completely through a substrate, a through-substrate via generally also requires an insulating layer lining the inner surfaces of the hole, and a conductive layer over the insulating layer. For a high aspect ratio via having a narrow diameter, it can be difficult to provide these insulating and conductive layers. One technique for forming such a via is described in co-pending patent application Ser. No. 11/167,014 to Borwick et al. and assigned to the present assignee. Here, wet processing is used to provide the via's sidewall seed layer and conductive layer. However, it can be difficult to achieve uniform seed layer coverage using wet processing, and particulates in the liquid solution can clog the vias, particularly those having a small diameter.

Another problem that can occur when fabricating through-substrate vias is the failure to completely fill one or more of the vias, such that continuous top-to-bottom openings through the via are present.

SUMMARY OF THE INVENTION

A through-substrate via fabrication method is presented which overcomes the problems noted above, providing high aspect ratio through-substrate vias with a process that eliminates problems associated with wet processing and fills openings through the vias that might otherwise be present.

The present method fabricates through-substrate vias through a semiconductor substrate which may contain active circuitry. The method requires first forming a through-substrate via hole in a semiconductor substrate. An isolation material which is electrically insulating, continuous and substantially conformal is then deposited directly onto the substrate and onto the interior walls of the via hole using atomic layer deposition (ALD). A conductive material is deposited into the via hole and over the isolation material using ALD, such that the conductive material is electrically continuous across the length of the via hole, and a polymer material is deposited—preferably by vapor deposition—over the conductive material such that any continuous top-to-bottom openings present in the via holes are filled by the polymer material. The polymer is preferably a member of the parylene family. When these steps are completed, the surfaces of the substrate can be planarized, and additional processing steps—such as photolithography to form electrical interconnects to the conductive material within the vias—can be performed on the planarized surfaces.

The fabrication method may further comprise preparing the isolation material by activating it with a seed layer which reacts with the conductive material, with the seed layer deposited by ALD.

The method enables the fabrication of through-substrate via holes having depths of greater than 100 µm. The through-substrate via hole is preferably formed by dry etching a first cavity having a first diameter into the substrate's first surface, and dry etching a second cavity having a second diameter into the substrate's second surface, such that the first and second cavities form a single continuous aperture through the substrate.

The present method may be successfully practiced at temperatures of less than 300° C., thereby avoiding damage to circuitry residing on the substrate that might otherwise occur. The basic fabrication method may be extended to form shielded or coaxial vias, triaxial vias, or vias having any desired number of conductive layers.

BRIEF DESCRIPTION OF THE DRAWINGS

The detailed description of embodiments of the invention will be made with reference to the accompanying drawings, wherein like numerals designate corresponding parts in the figures.

DETAILED DESCRIPTION OF THE INVENTION

Figure 1A:
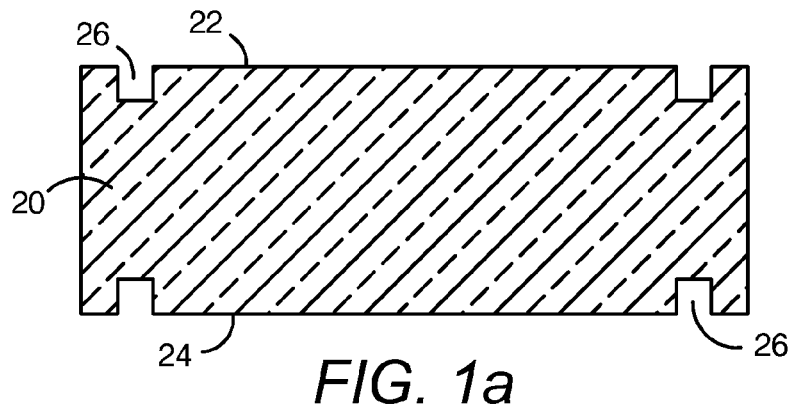
FIGS. 1a-1g are sectional views of a fabrication process for forming high aspect ratio through-substrate vias in accordance with the present invention.

The present method is directed to a process for fabricating high aspect ratio through-substrate vias. The basic process steps are illustrated in the series of sectional views shown in FIGS. 1a-1g. In FIG. 1a, a substrate 20 has a first surface 22 and a second surface 24. Circuitry (not shown) may be disposed on first surface 22, on second surface 24, and/or between surfaces 22 and 24. The substrate may be made from any of a number of semiconductor materials, including but not limited to, silicon, gallium arsenide or indium phosphide. Alignment marks 26 may be etched on the first and second surfaces, to facilitate alignment of the substrate during subsequent process steps.

Figure 1B:
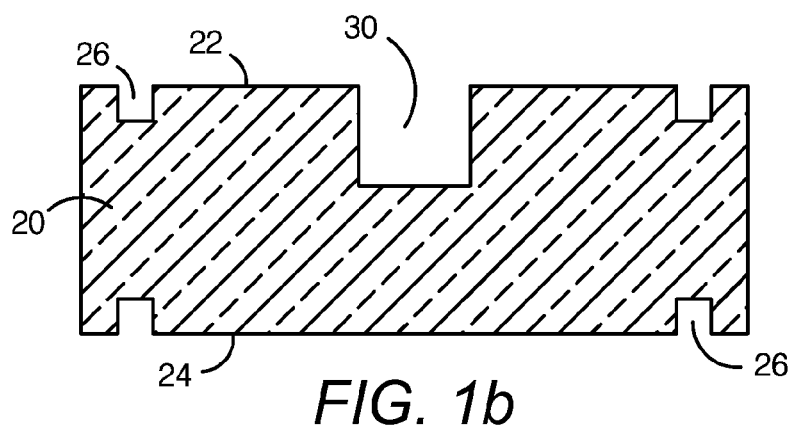
Figure 1C:
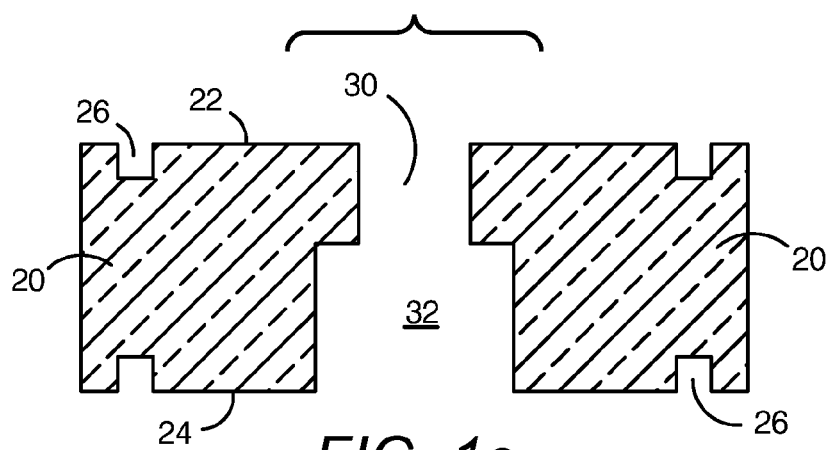

In FIG. 1b, a first cavity 30 is etched into first surface 22. The first cavity has a first diameter, and extends a first depth into the substrate. The first diameter is typically chosen to minimize the consumed circuit area on surface 22. The first depth is typically chosen to enable the first cavity to extend below the depth of any active circuitry on surface 22. Then, as shown in FIG. 1c, a second cavity 32 having a second diameter, is etched coaxially with first cavity 30 into second surface 24. The second cavity is etched to a second depth such that it communicates with first cavity 30 to form a continuous aperture through the entire thickness of the substrate. The first and second cavities preferably extend to depths in the range of 20 µm-200 µm and 100 µm-350 µm, respectively, and have diameters of 2 µm-8 µm and 6 µm-25 µm, respectively. The larger diameter of the second cavity enables a greater depth to be achieved at the same aspect ratio. This enables the continuous aperture to extend through a greater total wafer thickness while minimizing the circuit area on surface 22 consumed by the via.

The cavities are formed by dry etching, preferably using a deep reactive ion etching process ("DRIE"). A preferred DRIE process known as the Bosch process utilizes time-sequenced alternating etch and passivation steps. An etchant such as sulfur hexafluoride $SF_6$ is used to etch a portion of the cavity into the substrate. To passivate the side wall of the cavity and prevent further lateral etching, an insulating layer is subsequently deposited using a separate gas composition which includes a species such as octafluorocyclobutane $C_4F_8$. This process is repeated until the desired depth is achieved. Etching via this process allows for high selectivity and achieves substantially vertical side walls, with aspect ratios as high as 40:1 or more. This high aspect ratio facilitates the production of smaller diameter cavities and smaller via-to-via spacings, as it reduces the amount of lateral blooming during etching and reduces side wall scalloping.

Figure 1D:
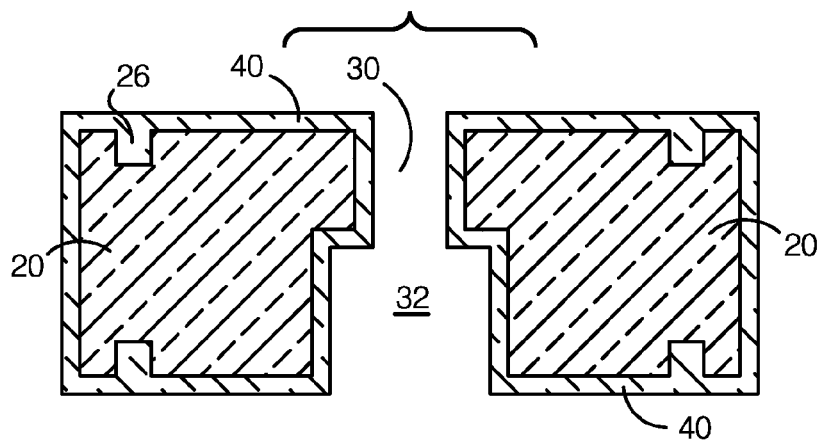

In FIG. 1d, an isolation material 40 is deposited directly onto substrate 20 and onto the interior walls of the aperture using atomic layer deposition (ALD), so as to provide an isolation layer that is electrically insulating, continuous and substantially conformal. The uniform coverage of the sidewalls with isolation material 40 acts to electrically isolate the through-substrate via from the substrate, as well as from other through-substrate vias being fabricated in substrate 20.

The isolation material preferably comprises inorganic oxides capable of providing electrical insulation and conformal surface coatings; metal oxides, including the oxides of aluminum, titanium, tantalum, niobium, zirconium, hafnium, lanthanum, yttrium, cerium, silicon, scandium, chromium, and erbium, are suitable.

Figure 1E:
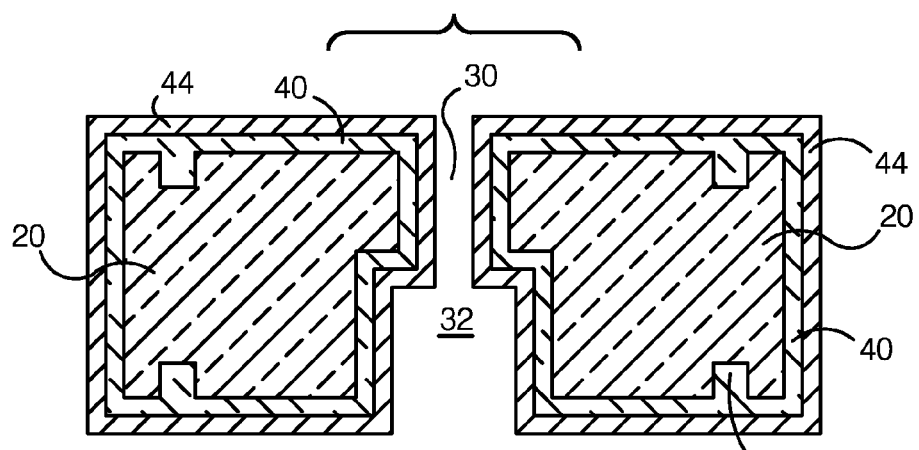

After the isolation material 40 has been deposited onto the substrate, an electrically conductive material 44 is deposited over the isolation material using ALD such that the conductive material is electrically continuous across the length of the via hole; this is shown in FIG. 1e. The conductive material is preferably chosen from a group consisting of nickel, palladium, platinum, ruthenium, tungsten, iridium, copper, titanium nitride or zinc oxide. The dry etching and ALD deposition steps are preferably conducted at a temperature of less than 300° C., such that circuitry residing on the substrate, such as CMOS circuitry, is not damaged by excessive heat.

ALD is a gas phase chemical process used to create thin film coatings that are highly conformal and have extremely precise thickness control. The majority of ALD reactions use two chemicals, typically called precursors. These precursors react with a surface one-at-a-time in a sequential manner By exposing the precursors to the growth surface repeatedly, a thin film is deposited. Additional details about ALD can be found, for example, in "Surface Chemistry for Atomic Layer Growth", S. M. George et al., *J. Phys. Chem.*, Vol. 100, No. 31 (1996), pp. 13121-13131.

In some cases, it may be desirable to 'activate' isolation material 40 prior to the deposition of conductive material 44, to make the isolation material more conducive to receiving the conductive material. This can be accomplished by depositing a seed layer (not shown) onto isolation material 40; this is preferably accomplished using ALD, which deposits a conformal seed layer uniformly on the deep-etched sidewalls of the via. A seed layer is selected which will cause a reaction with conductive material 44 when the conductive material is deposited onto the substrate; palladium is one possible seed layer material. Once isolation material 40 is activated, conductive material 44 is deposited onto the activated isolation material.

Figure 1F:
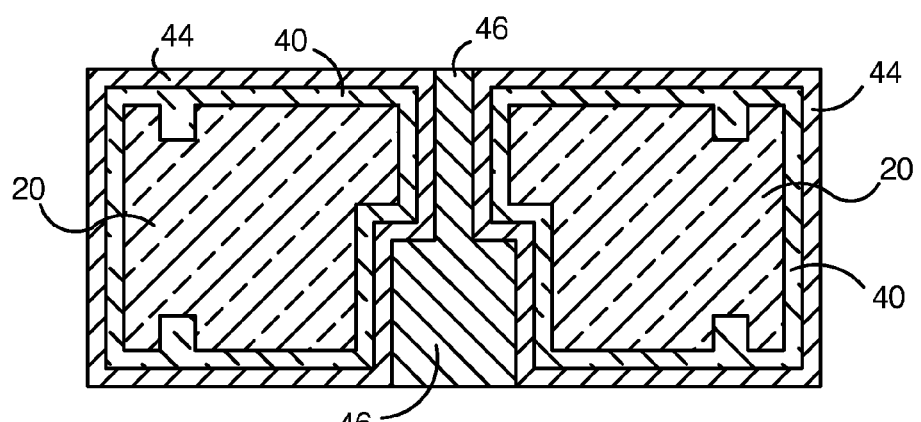

The structure of FIG. 1e provides a through-substrate via, with conduction through the via provided by conductive material 44. Preferably, any portions of cavities 30 and 32 which were not already filled by isolation material 40 and conductive material 44 are now filled with a metal 46, as shown in FIG. 1f. This hole filling is done for two reasons. First, processing of the substrate with the hole in it is difficult: photoresist materials may get sucked into the hole by vacuum chucks, and air bubbles that get trapped in the hole tend to pop and degrade the cosmetics of the subsequent surface pattern. Second, the conductive material layer 44 deposited by ALD is very thin, and hence may have a relatively high resistance. The hole is preferably filled using a plating process—preferably, an electroless plating of a material like nickel, gold, or copper; uniform electroless plating is facilitated by the uniform depositions achieved using ALD. This reduces the resistance of the center conductor and physically plugs the hole to permit resist processing. Electrolytic plating may also be used.

Figure 1G:
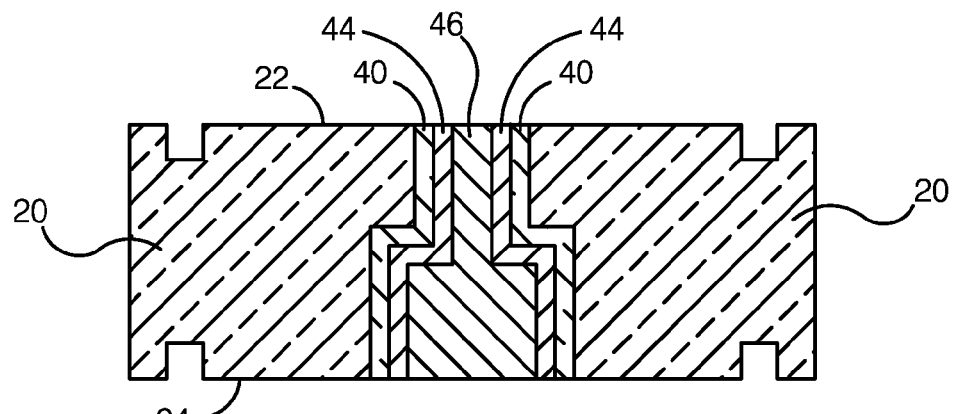

As illustrated in FIG. 1g, additional processing may be performed to remove the isolation and conductive layers from areas where they are not needed, but leaving the completed through-substrate via. Further, additional isolation layers and conductive metal traces may be processed on surfaces 22 and/or 24 to route the electrical interconnection points to the desired locations on the surfaces. These process steps are not shown, and use fabrication techniques well known to those skilled in semiconductor processing.

With the possible exception of the hole-filling step, the present method is an all-dry process, thereby eliminating the possibility of liquid solution particulates clogging the through-substrate vias, as may happen when using prior art techniques. Wet processing techniques may be used in the final steps of the process in FIG. 1 to plug the via, since at this stage the via is isolated and electrically continuous across its length, and thus clogging due to solution particulates does not reduce via operability. The present ALD-based process provides good control over layer thickness (typically, to within several nanometers), such that conformal coatings and high yields are reliably achieved. Furthermore, the ability to deposit both insulators and metals using ALD provides a means of forming both isolation and conductive layers in a single process operation. Note, however, that the processing time needed for the present process may be considerably longer than that required by prior art methods, but the process is compatible with batch fabrication and automated operation. Employing ALD results in all surfaces being coated with the material being deposited; as such, it is necessary to pattern and etch the substrate to remove the deposited isolation and conductive materials from areas where they are not needed. The present method enables high aspect ratio vias to be fabricated in substrates having a thickness of greater than 50 μm.

For some applications, such as 3D CMOS chip stacking, it is important that the through-substrate via process have a very high yield (>99.99%). The process described above achieves excellent yields, but in some cases the thin layers provided by ALD may result in vias that are not completely filled. This can make the performance of subsequent processing steps difficult or impossible. As noted above, wet processing techniques like electroless plating may be employed in the final steps of the process shown in FIG. 1 to plug the vias, but some vias may not plate due, for example, to contamination that blocks the solution transport into the small vias. An alternative technique for ensuring that the vias are completely plugged is now described.

As noted above, conduction through the via is provided by conductive material 44. To ensure that the through-substrate vias are completely filled, after conductive material 44 has been deposited, a polymer material—preferably a member of the parylene family—is deposited over the conductive material such that any continuous top-to-bottom openings present in the via holes are filled by the polymer material.

The polymer material is preferably vapor deposited. This serves to provide a conformal coating on the walls of any openings present through the vias, as well as to preserve the all-dry process described above. The polymer and conductive materials are then preferably patterned and dry etched such that the polymer material is confined to the interior of each of the via holes, and the conductive material is confined to the interior of the via holes and the area immediately surrounding the via holes on the first and second surfaces (22, 24) of substrate 20 such that the through-substrate vias are electrically isolated from each other.

With the steps discussed above completed, at least one of the first and second surfaces of the substrate can be planarized, and additional processing steps—such as photolithography to form electrical interconnects to the conductive material within the vias—can be performed on the planarized surfaces.

With one or both surfaces planarized, a second semiconductor substrate, which may contain active circuitry, can be arranged to be interconnected with the first substrate using the through-substrate vias in the first substrate and an interconnection means. The first and second substrates are preferably stacked, and employ an interconnection means between the substrates such as indium bumps, metal thermocompression bonds, solder bumps, or any of a number of other means known to those familiar with stacked substrates. The second substrate could also be processed as discussed above, with through-substrate via holes formed as described herein, with a polymer material deposited over the conductive material such that any continuous top-to-bottom openings present in the via holes are filled by the polymer material.

Figure 2A:
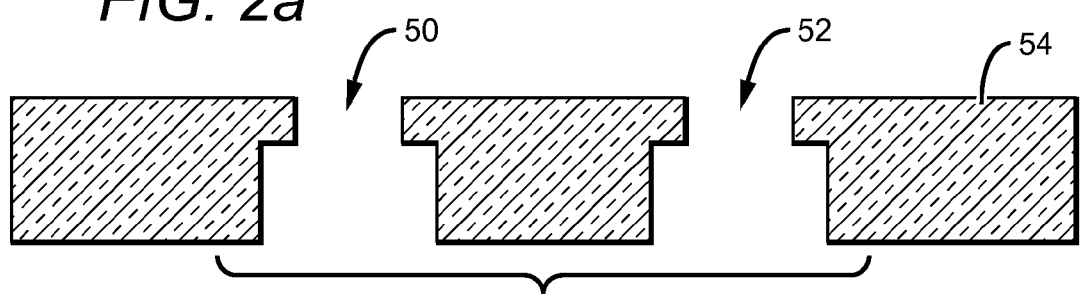
FIGS. 2a-2e are sectional views of a fabrication process for forming high aspect ratio through-substrate vias which includes the deposition of a polymer fill material in accordance with the present invention.
Figure 2B:
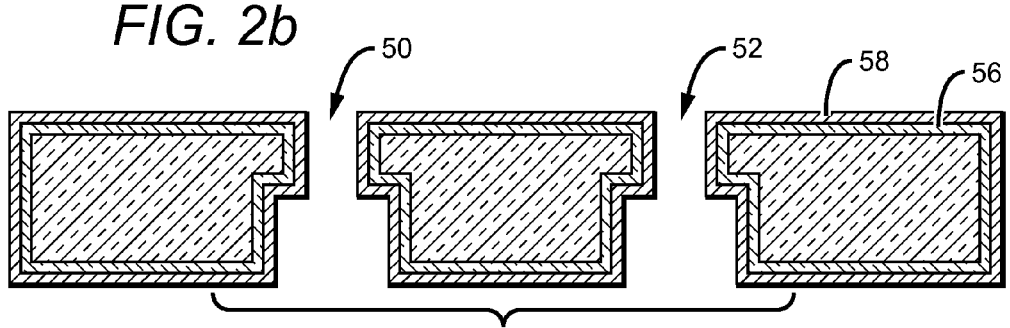
Figure 2C:
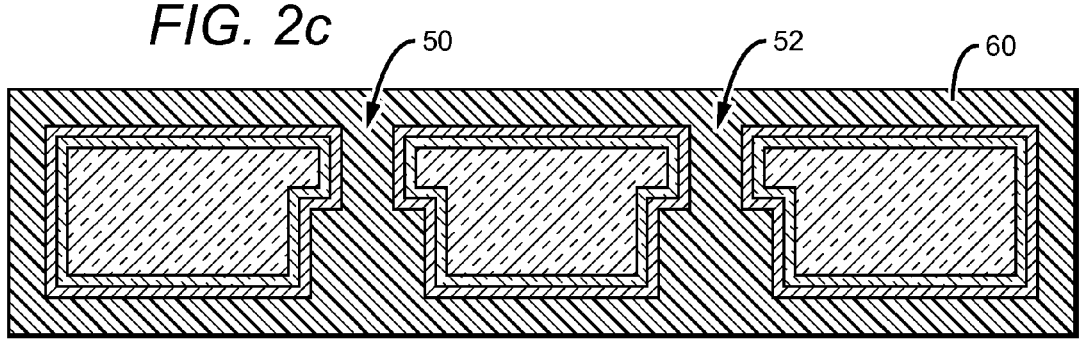

One possible set of steps which includes the polymer fill process described above is illustrated in the series of sectional views shown in FIGS. 2a-2e. In FIG. 2a, through-substrate vias 50, 52 are etched through a substrate 54. An isolation layer 56 and a conductive layer 58 are deposited in the vias and on the substrate using ALD (FIG. 2b). In FIG. 2c, a polymer material 60 is deposited, preferably by vapor deposition, to fill vias 50 and 52.

Figure 2D:
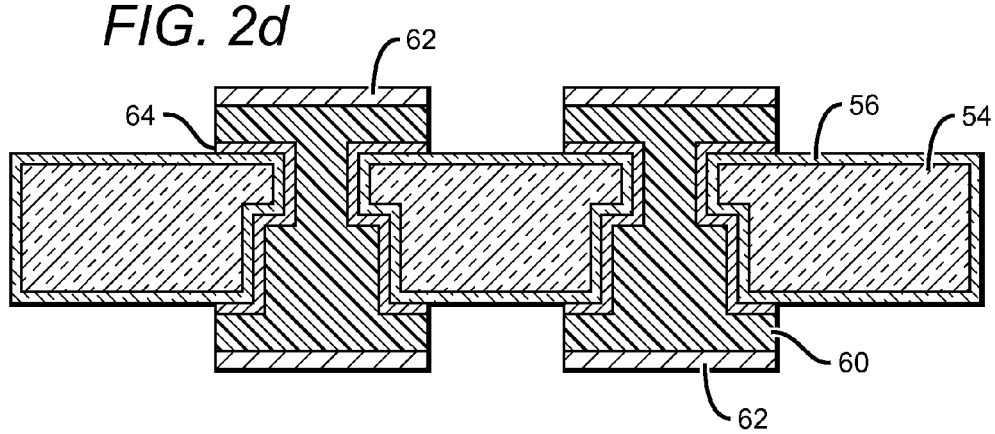
Figure 2E:
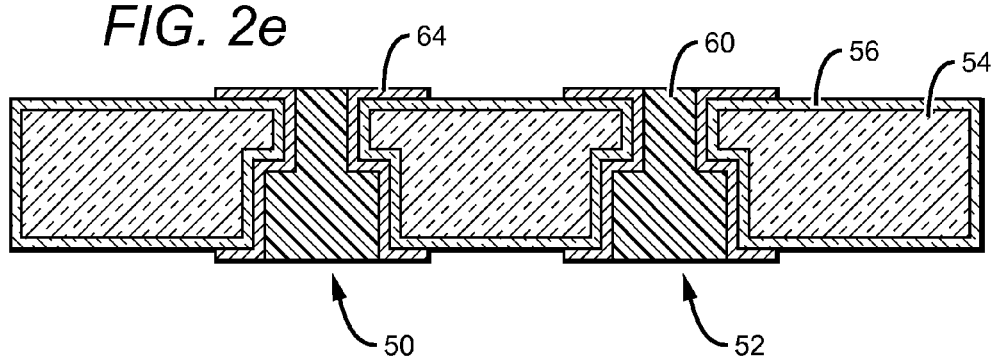

In FIG. 2d, a photoresist layer 62 is spun onto the structure, and conductive layer 58 and polymer layer 60 are patterned and etched as shown, leaving just the via metal 64. In FIG. 2e, the photoresist 62 and polymer material 60 above and below the top and bottom surfaces of substrate 54 are etched to complete the fabrication of filled vias 50 and 52. Both top and bottom surfaces would typically be processed in this way. With these steps completed, additional processing steps, such as the deposition of more metal layers and the formation of interconnects, can now be performed.

Note that high temperature processing steps should be avoided after the polymer material has been deposited, unless the polymer is a high temperature parylene.

Figure 3:
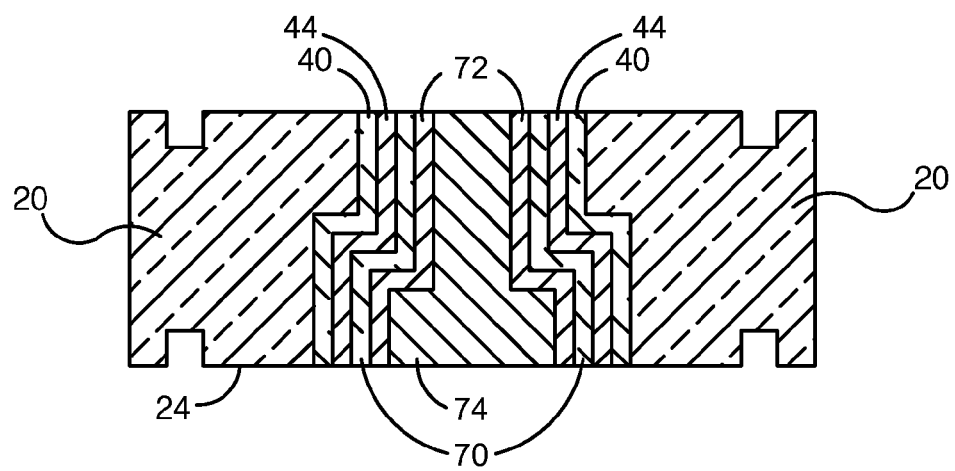
FIG. 3 is a sectional view of a triaxial via formed in accordance with the present fabrication process.

The processes described above can be extended to form a shielded or coaxial via. A coaxial via is shown in FIG. 3. After completing the process steps shown in FIGS. 1a-1e, a second electrically insulating, continuous and substantially conformal isolation layer 50 would be deposited by ALD, followed by the deposition by ALD of a second conductive layer 52 which is electrically continuous across the length of the via hole. Any portions of cavities 30 and 32 which were not already filled by isolation layers 40, 70 and conductive layers 44, 72 are now preferably filled with a metal 74. Additional processing steps remove the isolation and conductive layers from areas where they are not needed, leaving the completed through-substrate via as shown. Further processing would be needed to form metallization on one or both of the substrate surfaces to provide independent connections to both the center metal (74) and shield metal (44) of the coaxial via. Additional dielectric layers of adequate thickness, comprising, for example, plasma-enhanced chemical vapor deposition (PECVD) oxide, may be deposited between the two metal deposition steps (layers 44 and 72, respectively) to facilitate the processing to make independent connections to the two metal layers. This would provide an etch stop layer to permit patterning of layer 72 without exposing layer 44. Further, additional isolation layers and conductive metal traces may be processed on the device surfaces to route the electrical interconnection points to the desired locations on the surfaces. These process steps (not shown) use fabrication techniques well known to those skilled in semiconductor processing.

Note that a coaxial via could also be formed by a method which includes the polymer fill steps described above and illustrated in FIGS. 2a-2e. After completing the process steps shown in FIGS. 2a-2b, a second isolation layer such as layer 70 and a second conductive layer such as layer 72 would be deposited using ALD. This would be followed by the polymer fill deposition, patterning and etching steps described above and shown in FIGS. 2c-2e. Note that this structure could function as either a coaxial via, or as a capacitor.

The present processes can be extended in this way until as many conductive layers as needed are provided. For example, a triaxial via can be formed by following the process steps shown in FIGS. 1a-1e (or FIGS. 2a-2b) with the deposition of a second layer of isolation material over conductive material 44, the deposition of a second layer of conductive material over the second isolation material layer, the deposition of a third layer of isolation material over the second layer of conductive material, and the deposition of a third layer of conductive material over the third isolation material layer, with each deposition performed using ALD. The depositions are performed such that the second and third isolation material layers are electrically insulating, continuous and substantially conformal, and the second and third conductive material layers are electrically continuous across the length of the via hole. Any portions of cavities 30 and 32 which were not already filled by the three isolation layers and three conductive layers would preferably be filled with a metal (or with a polymer fill material as described above). Additional processing steps remove the isolation and conductive layers from areas where they are not needed, and provide metallization on the substrate surfaces to provide independent connections to each of the conductive material layers of the triaxial via.

For a basic single conductor via, or a coaxial via, the dielectric constant of the isolation layer is preferably low, in order to minimize the capacitance of the interconnection provided by the via. This may not be an issue for a triaxial via, since the conductive material layer serving as the shield could be biased to a voltage that compensates for the via's capacitance.

The present processes are well-suited to use with a multilayer stack of substrates, in which a substrate containing through-substrate vias as described herein is bonded together with a plurality of additional substrates. The bonding between substrates is effected with, for example, solder bumps, indium columns, Au—Au thermocompression bonding or glue. The bonding means provides a mechanical function, and can also provide an electrical function when the bonds effect electrical interconnections between individual substrate layers. Signals may be routed from one substrate to another through vias as described herein, as well as via the bonding means.

Although the foregoing described the invention with preferred embodiments, this is not intended to limit the invention. Indeed, embodiments of this invention can be combined with other circuit chips and systems. For instance, embodiments of the invention can be used for compact electronic circuits with multiple stacking layers and circuitry. Other uses include an enhanced three-dimensional electronic imager having wide dynamic range and pixel level image processing due to the density of the vias on the wafer, RF filters, FPA ROICs, and 3D consumer electronics. Other applications include a vertically interconnected sensor array which provides signal processing in conjunction with infrared sensor systems, an arrayed acoustic sensing system, LADAR, and microprocessor circuits in which latency across the chip presents an issue.

As seen from the foregoing, substrates having high aspect ratio through-substrate vias are intended to be used as stand alone substrates or in combination with other types of substrates or systems. In this regard, the foregoing is intended to cover all modifications and alternative constructions falling within the spirit and scope of the invention as expressed in the appended claims, wherein no portion of the disclosure is intended, expressly or implicitly, to be dedicated to the public domain if not set forth in the claims.

We claim:

1. A process for fabricating one or more through-substrate vias in a first semiconductor substrate which may contain active circuitry, the first substrate having a first surface and a second surface, comprising:
    forming one or more through-substrate via holes in a first semiconductor substrate;
    depositing an isolation material directly onto the first substrate and onto the interior walls of each of said through-substrate via holes using atomic layer deposition (ALD) such that said isolation material is electrically insulating, continuous and substantially conformal;
    depositing conductive material into each of said via holes over said isolation material using ALD such that said conductive material is electrically continuous across the length of each of said via holes;
    depositing a polymer material over said conductive material such that any continuous top-to-bottom openings present in said via holes are filled by said polymer material;
    patterning and dry etching said polymer and conductive materials such that said polymer material is confined to the interior of each of said via holes and said conductive material is confined to the interior of said via holes and the area immediately surrounding said via holes on said first and second surfaces of said first substrate such that said through-substrate vias are electrically isolated from each other; and
    planarizing at least one of said first and second surfaces of said first substrate after said patterning and dry etching of said polymer and conductive materials to provide a planar surface suitable for photolithographic processing.

2. The process of claim 1, wherein each of said through-substrate via holes are formed by:

dry etching a first cavity into said first substrate's first surface, said first cavity having a first diameter; and dry etching a second cavity into said first substrate's second surface, said second cavity having a second diameter, wherein the first and second cavities form a single continuous aperture through the first substrate.

3. The process of claim 1, wherein said polymer material is a member of the parylene family.

4. The process of claim 1, wherein said polymer material is vapor deposited.

5. The process of claim 1, further comprising performing additional processing steps on said planarized surfaces to form electrical interconnects to the conductive material within said vias.

6. The process of claim 1, further comprising:

providing a second semiconductor substrate which may contain active circuitry, the second substrate having a first surface and a second surface and arranged to be interconnected with said first substrate using said through-substrate vias in said first substrate and an interconnection means.

7. The process of claim 6, wherein said first and second substrates are stacked and said interconnection means is selected from a group comprising indium bumps, metal thermocompression bonds and solder bumps between said substrates.

8. The process of claim 6, further comprising:

forming one or more through-substrate via holes in said second substrate;

depositing an isolation material directly onto the second substrate and onto the interior walls of each of said through-substrate via holes using atomic layer deposition (ALD) such that said isolation material is electrically insulating, continuous and substantially conformal;

depositing conductive material into each of said via holes over said isolation material using ALD such that said conductive material is electrically continuous across the length of each of said via holes; and depositing a polymer material over said conductive material such that any continuous top-to-bottom openings present in said via holes are filled by said polymer material.

9. The process of claim 1, further comprising:

depositing a second layer of isolation material over said conductive material such that said second layer of isolation material is electrically insulating, continuous and substantially conformal; and depositing a second layer of conductive material over said second layer of isolation material such that said second layer of conductive material is electrically continuous across the length of said via hole;

such that said layers of isolation material and conductive material function as a capacitor.

10. The process of claim 1, further comprising:

depositing a second layer of isolation material over said conductive material such that said second layer of isolation material is electrically insulating, continuous and substantially conformal; and depositing a second layer of conductive material over said second layer of isolation material such that said second layer of conductive material is electrically continuous across the length of said via hole;

such that said layers of isolation material and conductive material function as a coaxial via through said substrate.

11. The process of claim 10, further comprising:

depositing a third layer of isolation material over said second layer of conductive material such that said third layer of isolation material is electrically insulating, continuous and substantially conformal; and depositing a third layer of conductive material over said second layer of isolation material such that said third layer of conductive material is electrically continuous across the length of said via hole;

such that said layers of isolation material and conductive material form a triaxial via through said substrate.

12. The process of claim 1, wherein said steps of forming the via holes, depositing the isolation material, depositing the conductive material and depositing the polymer material are performed at a temperature of <300° C.

13. The process of claim 1, further comprising preparing said isolation material by activating it with a seed layer which reacts with said conductive material.

14. The process of claim 1, wherein the conductive material is chosen from a group consisting of nickel, palladium, platinum, ruthenium, tungsten, iridium, copper, titanium nitride or zinc oxide.

15. The process of claim 1, wherein said deposition of an isolation material by ALD comprises deposition of inorganic oxides capable of providing electrical insulation and conformal surface coatings.

16. The process of claim 15, wherein said isolation material is chosen from a group of metal oxides comprising the oxides of aluminum, titanium, tantalum, niobium, zirconium, hafnium, lanthanum, yttrium, cerium, silicon, scandium, chromium, and erbium.

17. The process of claim 1, further comprising forming metallization on one or both of said first and second substrate surfaces to provide electrical connections to the conductive material layers of said through-substrate via.

* * * * *